United States Patent
Jenne

(10) Patent No.: US 7,881,118 B2
(45) Date of Patent: Feb. 1, 2011

(54) SENSE TRANSISTOR PROTECTION FOR MEMORY PROGRAMMING

(75) Inventor: Fredrick Jenne, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 97 days.

(21) Appl. No.: 12/154,585

(22) Filed: May 22, 2008

(65) Prior Publication Data

US 2008/0298132 A1  Dec. 4, 2008

Related U.S. Application Data

(60) Provisional application No. 60/931,972, filed on May 25, 2007.

(51) Int. Cl.
*G11C 16/06* (2006.01)

(52) U.S. Cl. ............... 365/185.21; 365/185.18; 365/185.29

(58) Field of Classification Search ............ 365/185.21, 365/185.18, 185.29
See application file for complete search history.

(56) References Cited

U.S. PATENT DOCUMENTS

| | | | |
|---|---|---|---|
| 3,636,530 A | 1/1972 | Mark et al. |
| 3,676,717 A | 7/1972 | Lockwood |
| 3,950,737 A | 4/1976 | Uchida et al. |
| 4,044,343 A | 8/1977 | Uchida |
| 4,090,259 A | 5/1978 | Wilcock et al. |
| 4,143,286 A | 3/1979 | Koike |
| 4,158,241 A | 6/1979 | Takemae et al. |
| 4,270,188 A | 5/1981 | Saito |
| 4,271,487 A | 6/1981 | Craycraft et al. |
| 4,370,798 A | 2/1983 | Lien et al. |
| 4,403,306 A | 9/1983 | Tokushige et al. |
| 4,527,255 A | 7/1985 | Keshtbod |
| 4,541,006 A | 9/1985 | Ariizumi et al. |
| 4,541,073 A | 9/1985 | Brice et al. |
| 4,560,419 A | 12/1985 | Bourassa et al. |
| 4,651,303 A | 3/1987 | Dias et al. |
| 4,675,715 A | 6/1987 | Lepselter et al. |
| 4,679,170 A | 7/1987 | Bourassa et al. |
| 4,703,456 A | 10/1987 | Arakawa |
| 4,774,203 A | 9/1988 | Ikeda et al. |
| 4,799,194 A | 1/1989 | Arakawa |
| 4,870,615 A | 9/1989 | Maruyama et al. |
| 4,878,203 A | 10/1989 | Arakawa |
| 4,904,613 A | 2/1990 | Coe et al. |
| 5,029,132 A | 7/1991 | Arakawa |

(Continued)

FOREIGN PATENT DOCUMENTS

JP  6136994 A1  7/1998

OTHER PUBLICATIONS

PCT International Search Report and Written Opinion of the International Searching Authority, PCT/US08/06622 filed May 23, 2008, mailed Sep. 9, 2008.

(Continued)

*Primary Examiner*—Richard Elms
*Assistant Examiner*—Hien N Nguyen

(57) ABSTRACT

A method and apparatus for protecting a sense transistor in a sense amplifier during memory programming and erase operations, and for increasing the coupling efficiency of the memory device during the programming and erase operations may include floating a first terminal and a second terminal of the sense transistor while programming and erasing the memory device.

11 Claims, 10 Drawing Sheets

U.S. PATENT DOCUMENTS

| | | | |
|---|---|---|---|
| 5,051,958 A | 9/1991 | Arakawa | |
| 5,065,362 A | 11/1991 | Herdt et al. | |
| 5,097,449 A | 3/1992 | Cuevas | |
| 5,189,641 A | 2/1993 | Arakawa | |
| 5,602,776 A | 2/1997 | Herdt et al. | |
| 5,812,477 A | 9/1998 | Casper et al. | |
| 5,999,447 A | 12/1999 | Naura et al. | |
| 6,141,247 A | 10/2000 | Roohparvar et al. | |
| 6,219,279 B1 * | 4/2001 | Manolescu et al. | 365/185.18 |
| 6,297,103 B1 | 10/2001 | Ahn et al. | |
| 6,534,364 B1 | 3/2003 | Erdelijac et al. | |
| 6,617,914 B1 | 9/2003 | Kothandaraman | |
| 6,707,715 B2 * | 3/2004 | Michael et al. | 365/185.18 |
| 6,781,916 B2 | 8/2004 | McClure | |
| 6,956,779 B2 * | 10/2005 | Tran | 365/205 |
| 7,031,189 B2 | 4/2006 | Pascucci | |
| 7,031,193 B2 * | 4/2006 | Micheloni et al. | 365/185.22 |
| 7,149,114 B2 * | 12/2006 | Taheri et al. | 365/185.08 |
| 7,242,621 B2 * | 7/2007 | Mirabel et al. | 365/185.29 |
| 7,388,777 B2 | 6/2008 | Shiba et al. | |
| 7,671,401 B2 | 3/2010 | Fang et al. | |
| 2002/0008992 A1 | 1/2002 | Tanaka et al. | |
| 2003/0026133 A1 | 2/2003 | Michael et al. | |
| 2005/0286303 A1 | 12/2005 | Mirabel et al. | |

OTHER PUBLICATIONS

USPTO Requirement for Restriction/Election for U.S. Appl. No. 12/154,584 dated Mar. 31, 2010; 6 pages.

International Search Report for International Application No. PCT/US08/06628 mailed Sep. 18, 2008; 10 pages.

The Written Opinion of the International Searching Authority for International Application No. PCT/US08/06628 mailed Sep. 18, 2008; 4 pages.

USPTO Notice of Allowance for U.S. Appl. No. 10/803,011 dated Aug. 3, 2006; 7 pages.

USPTO Final Rejection for U.S. Appl. No. 10/803,011 dated May 30, 2006; 13 pages.

USPTO Non-Final Rejection for U.S. Appl. No. 10/803,011 dated Dec. 9, 2005; 13 pages.

USPTO Miscellaneous Action for U.S. Appl. No. 10/803,011 dated Mar. 18, 2005; 1 page.

International Search Report of the International Searching Authority for International Application No. PCT/US2005/008154 mailed Jul. 1, 2005; 2 pages.

Written Opinion of the International Searching Authority for International Application No. PCT/US2005/008154 received Jun. 29, 2005; 5 pages.

USPTO Notice of Allowance for U.S. Appl. No. 08/549,483 dated Aug. 8, 1996; 3 pages.

USPTO Non-Final Rejection for U.S. Appl. No. 08/549,483 dated May 29, 1996; 5 pages.

USPTO Notice of Allowance for U.S. Appl. No. 07/361,033 dated Apr. 30, 1991; 3 pages.

USPTO Final Rejection for U.S. Appl. No. 07/361,033 dated Jan. 18, 1991; 5 pages.

USPTO Non-Final Rejection for U.S. Appl. No. 07/361,033 dated Jun. 12, 1990; 11 pages.

USPTO Non-Final Rejection for U.S. Appl. No. 12/154,584 dated Aug. 9, 2010; 8 pages.

* cited by examiner

SENSE TRANSISTOR PROTECTION FOR MEMORY PROGRAMMING

This application claims the benefit of the filing date of U.S. Provisional Patent Application No. 60/931,972, filed on May 25, 2007, which is incorporated herein in its entirety by reference.

TECHNICAL FIELD

The present invention relates to nonvolatile semiconductor memory and, in particular, to the protection of sense transistors during high voltage programming of floating gate memories.

BACKGROUND

Stored charge non-volatile memory devices such as floating gate flash memory devices, for example, use charge on a floating gate of an MOS transistor to program the logic state of the transistor. FIG. 1 illustrates, in a somewhat idealized form not drawn to scale, the cross-section of a floating gate transistor, using an NMOS structure as an example (an equivalent PMOS device can also be made). The floating gate transistor includes a P-type silicon substrate with n+ source and drain diffusions which define the length of a channel region. Immediately above the channel is an insulating layer of oxide, typically silicon dioxide. Immediately above this oxide layer is the conductive floating gate, typically may of polysilicon. Immediately above the floating gate is another later of oxide, and above that layer is the control gate, typically another polysilicon gate. A passivating oxide layer, typically silicon dioxide, protects the above-described layers from contaminants.

Programming voltages can be applied to the transistor between the control gate and the substrate or source and drain diffusions to add or remove charge from the floating gate by hot carrier injection (HCI) or by Fowler-Nordheim tunneling. After the programming voltage is removed, the charge is retained on the floating gate because the floating gate is electrically isolated by the insulating oxide that prevents the charge from leaking to the channel, the source, the drain or the control gate of the transistor. The presence of charge on the floating gate causes a shift in the threshold voltage of the transistor, which is the gate-to-source voltage that turns the transistor on and allows current to flow from drain to source under an applied drain-to-source voltage. For the NMOS device illustrated in FIG. 1, a positive voltage from the control gate to the substrate causes electrons to migrate from the channel to the floating gate, which raises the threshold voltage of the device (conventionally known as the "programmed" state). A negative voltage from the control gate to the substrate causes holes to migrate from the channel to the floating gate, which lowers the threshold voltage of the device (conventionally known as the "erased" state). The two different threshold voltages can be associated with different logic or data states (e.g., "1" and "0"). The voltage difference between the two thresholds, known as the sense window, is a measure of the integrity of the stored data.

Conventionally, the state of a floating gate memory transistor is read by applying a known gate-to-source voltage with a value between the programmed threshold voltage and the erased threshold voltage and sensing the current that flows through the memory transistor under an applied drain-to-source voltage. However, the read current can disturb the stored charge and cause leakage that reduces the sense window. If a large number of reads are performed without an intervening program or erase operation, the integrity of the stored data may be lost. In a floating gate device, such as that illustrated in FIG. 1, the floating gate is not directly accessible for measurement, so the only way to sense the state of the device is to detect the read current.

One approach to this problem has been to synthesize a floating gate device from two conventional MOS transistors and to directly sense the voltage on the floating gate with a high input impedance sense amplifier that does not disturb the stored charge. In this approach, however, the sense transistor in the sense amplifier is exposed to large programming and erase voltages that can damage the sense transistor, causing it to leak charge from the floating gate and disturb the state of the floating gate device.

BRIEF DESCRIPTION OF THE DRAWINGS

The present invention is illustrated by way of example and not limitation in the figures of the accompanying drawings, in which.

DETAILED DESCRIPTION

Methods and apparatus for the protection of sense transistors during the programming of non-volatile memories are described. In the following description, numerous specific details are set forth such as examples of specific components, devices, methods, etc., in order to provide a thorough understanding of embodiments of the present invention. It will be apparent, however, to one skilled in the art that these specific details need not be employed to practice embodiments of the present invention. In other instances, well-known materials or methods have not been described in detail in order to avoid unnecessarily obscuring embodiments of the present invention.

Figure 1:
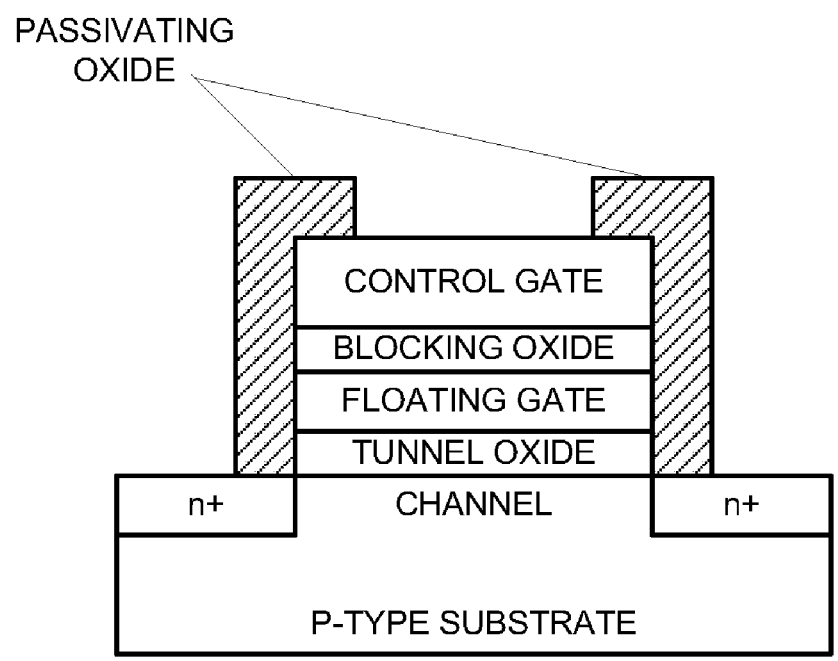
FIG. 1 illustrates a conventional floating gate memory device.
Figure 2A:
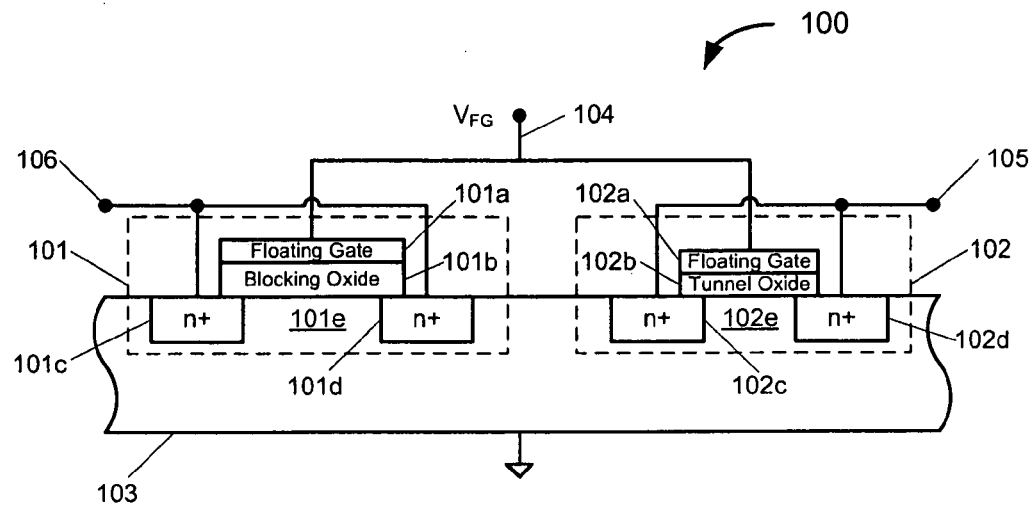
FIG. 2A illustrates a floating gate memory device synthesized from two MOS transistors.

FIG. 2A illustrates a floating gate transistor memory transistor 100 synthesized from a series connection of two conventional MOS transistors 101 and 102 (illustrated as NMOS transistors for convenience) fabricated on a common substrate 103. Transistor 101 includes a gate 101a, an insulating oxide layer 101b and source and drain diffusions 101c and 101d defining a channel region 101e. Transistor 102 includes a gate 102a, an insulating oxide layer 102b and source and drain diffusions 102c and 102d defining a channel region 102e. As illustrated in FIG. 2A, gates 101a and 102a are connected together to form a distributed floating gate with an accessible common node 104 where a floating gate voltage $V_{FG}$ can be measured. The source and drain 101c and 101d of transistor 101 are connected to form one programming node 106 and the source and drain 102c and 102d of transistor 102 are connected to form another programming node 105.

Transistor 102 can be fabricated with gate 102a dimensions and oxide layer 102b thickness, such that transistor 102 functions as a tunnel diode when gate and source diffusions 102c and 102d are connected together as illustrated in FIG. 2A. Tunnel diode configurations of MOS transistors are known in the art and, therefore, are not described in further detail. Transistor 101 can be fabricated with gate 101a dimensions and oxide layer 101b thickness, such that transistor 101 functions as a capacitor when gate and source diffusions 101c and 101d are connected together as illustrated in FIG. 2A. Capacitor configurations of MOS transistors are known in the art and, therefore, are not described in further detail. The series connection of transistor 102 and transistor 101 results in a three terminal device with an input terminal 105, an output terminal 106 and the aforementioned floating gate terminal 104.

Figure 2B:
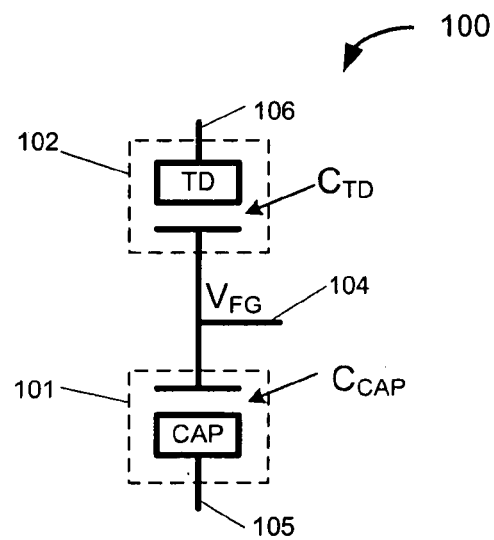
FIG. 2B is a schematic representation of the floating gate memory device of FIG. 2A.

FIG. 2B illustrates floating gate transistor 100 schematically, where transistor 102 is identified as a tunnel diode (TD) and transistor 101 is identified as a capacitor (CAP). The tunnel diode provides the tunneling or hot carrier injection of holes and/or electrons to the floating gate during programming and erasing operations. The tunnel diode has an equivalent capacitance $C_{TD}$, which is determined by the geometry of its gate 102a, channel 102e and diffusion regions 102c and 102d, as well as the thickness and dielectric constant of the intervening oxide 102b. The capacitor in series with the tunnel diode has an equivalent capacitance $C_{CAP}$, which is determined by the geometry of its gate 101a, channel 101e and diffusion regions 101c and 101d, as well as the thickness and dielectric constant of the intervening oxide 101b. For efficient (i.e., fast) programming and erasing, as described below, $C_{CAP}$ should be much larger than $C_{TD}$.

Figure 3A:
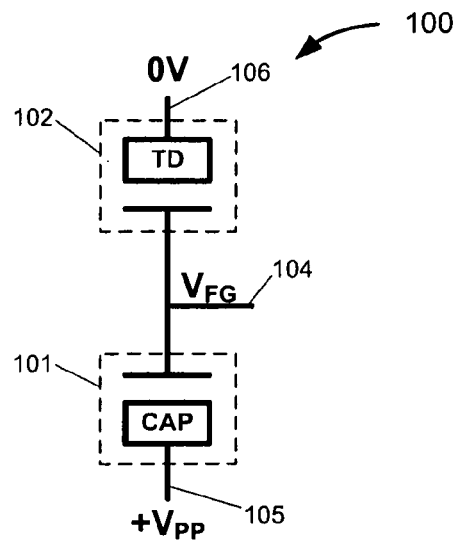
FIG. 3A illustrates erasing the floating gate memory device of FIG. 2B.

FIG. 3A illustrates how floating gate transistor 100 is erased (the following description assumes that floating gate transistor 100 is synthesized from NMOS transistors as described above. It will be appreciated that PMOS transistors may also be used and that the polarity of program and erase voltages will be reversed accordingly). A positive programming voltage pulse $V_{PP}$ is applied to programming node 105 while the other programming node 106 is grounded. The transistor forms a capacitive voltage divider such that the voltage on the floating gate is given by:

$$V_{FG} = V_{PP} \frac{C_{CAP}}{(C_{TD} + C_{CAP})}$$

For rapid programming (i.e., high tunneling flux), $V_{FG}$ should be as high as possible without damaging or breaking down the tunnel diode dielectric 102b, so $C_{CAP}$ is designed to be much larger than $C_{TD}$. For example, if $V_{PP}$=11 volts and $C_{CAP}/C_{TD}$=10, then:

$$V_{FG} = 11 \frac{10}{(1+10)} = 10 \text{ volts}$$

With 10 volts across the tunnel diode, electrons will tunnel through the diode and charge the floating gate. The duration of the programming pulse determines how much charge is transferred to the floating gate. The negative charge has the effect of lowering $V_{FG}$. Then, when the programming voltage $V_{PP}$ is removed, the accumulated negative charge is retained on the floating gate, which will have a negative potential approximately equal to the magnitude of the voltage reduction due to tunneling.

Figure 3B:
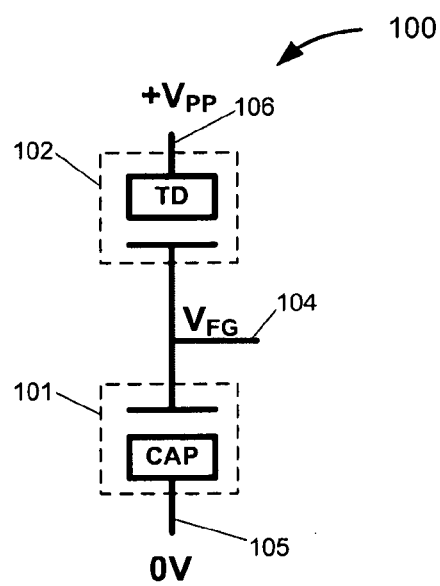
FIG. 3B illustrates programming the floating gate memory device of FIG. 2B.
Figure 4:
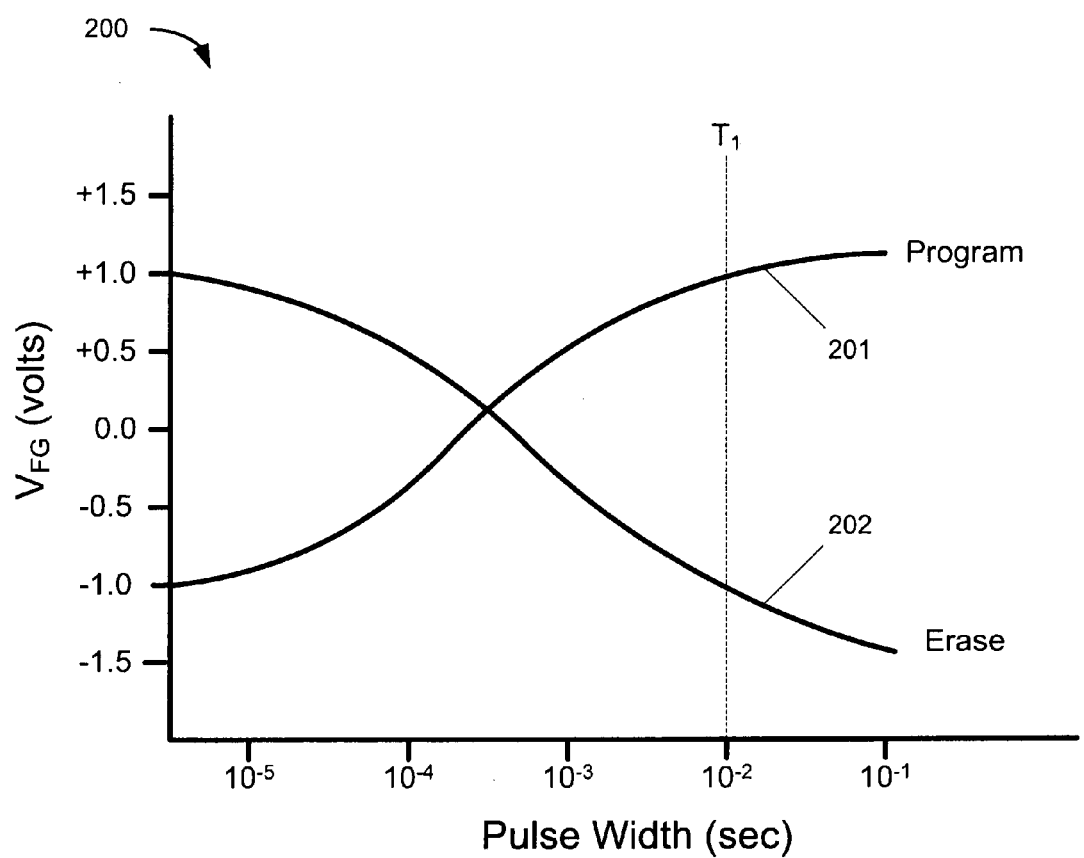
FIG. 4 illustrates programming and erase threshold voltage profiles of the floating gate memory device of FIG. 2B.

Programming is accomplished by connecting $V_{PP}$ to programming node 106 and grounding programming node 105 as illustrated in FIG. 3B. In this case, the voltage across the tunnel diode capacitance is again 10 volts (so that the floating gate is initially at a 1 volt potential), but the reverse polarity causes electrons to tunnel off of the floating gate (or equivalently, holes to tunnel to the floating gate). The depletion of electrons (or the addition of holes) due to tunneling raises the value of $V_{FG}$. Then, when the programming voltage $V_{PP}$ is removed, the floating gate will have a positive potential approximately equal to the magnitude of the voltage increase due to tunneling. The magnitude of the residual floating gate voltage is a function of the duration of the programming or erase voltage pulses, as illustrated in FIG. 4, where after a time T1, the residual floating gate voltage is approximately +1 volt (curve 201) after programming and approximately −1 volt (curve 202) after erase. The exemplary voltages used herein are selected for ease of explanation.

Figure 5A:
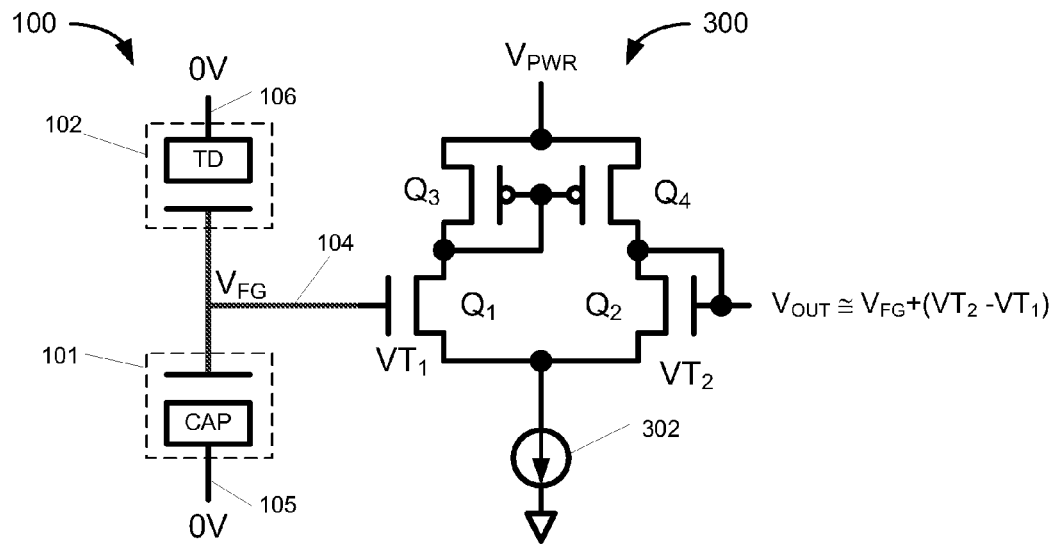
FIG. 5A is a schematic illustration of a conventional sense amplifier configuration.

To read the floating gate voltage $V_{FG}$ of memory transistor 100 (i.e., to determine the logic state of the memory transistor), the floating gate may be connected to a conventional differential sense amplifier as illustrated in FIG. 5A. In FIG. 5A, transistor $Q_1$ is an MOS sense transistor, $Q_2$ is an MOS output transistor and diode-connected MOS transistors $Q_3$ and $Q_4$ operate as a current mirror, as is known in the art, which forces the current through $Q_2$ to equal the current through $Q_1$. A common source connection between Q1 and Q2 is connected to a current sink 302 that sinks a current I. As a result, a current I/2 flows through each of $Q_1$ and $Q_2$. The output voltage $V_{OUT}$ reflects the floating gate voltage to the extent that the threshold voltage $VT_1$ of $Q_1$ matches the threshold voltage $VT_2$ of $Q_2$.

Figure 5B:
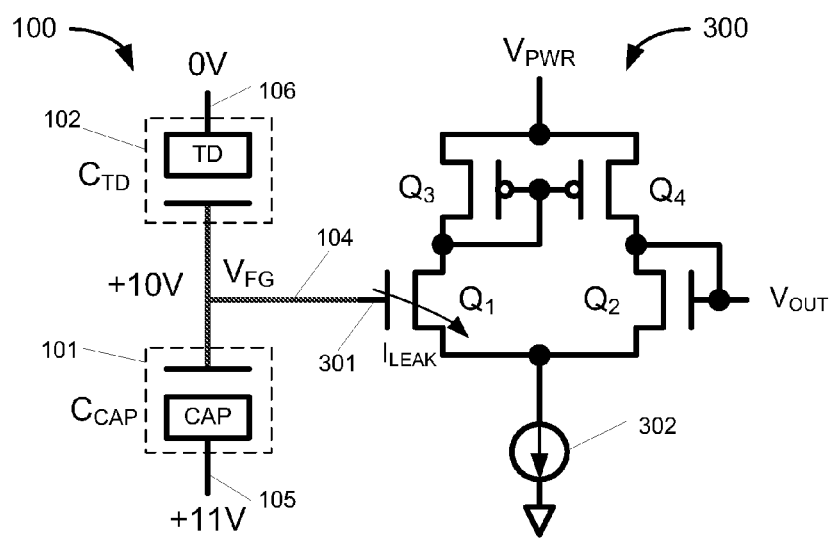
FIG. 5B is a schematic illustration of a damage mechanism in the conventional sense amplifier configuration.
Figure 5C:
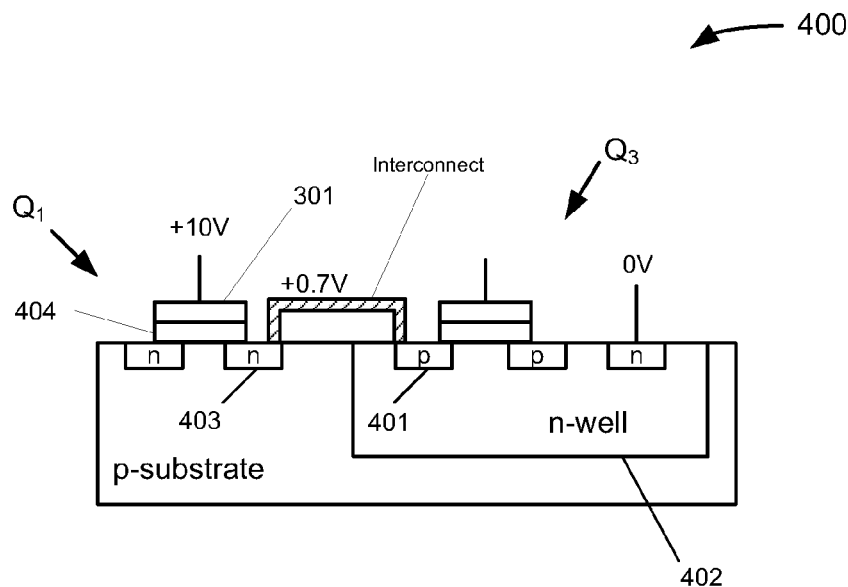
FIG. 5C illustrates a cross-section of a conventional sense amplifier circuit.

This configuration has significant disadvantages. For example, when memory transistor 100 is being erased, as illustrated in FIG. 5B, the gate 301 of sense transistor $Q_1$ is exposed to +10 volts and $Q_1$ sees this voltage across its gate oxide. This can be seen with reference to FIG. 5C, which shows a cross-section 400 of NMOS sense transistor $Q_1$ and PMOS current mirror transistor $Q_3$. It can be seen in FIG. 5C that the PN junction formed by the source 401 of Q3 and its n-well 402 will clamp the drain 403 of Q1 to the diode drop of approximately 0.7 volts (where the n-well is grounded at 0 volts). As a result, the gate oxide 404 of Q1 will be exposed to approximately a 9.3 volt pulse during erase operations, which can damage the oxide 404. The damage can form traps in the oxide that allow trap-assisted tunneling current at low field levels. This stress induced leakage current leaks charge from the floating gate of the memory transistor and reduces its data retention. Additionally, the oxide damage can alter the threshold voltage $VT_1$ of $Q_1$, which will increase the offset error of the sense amplifier and increase the likelihood of data errors. The same voltage stress conditions can arise with opposite polarity, for example, during programming operations in the case of a PMOS type sense transistor coupled to an NMOS current mirror transistor, or in the case where a negative programming voltage is applied to programming node 105 (e.g., −11 volts, in which case the voltage on the gate 301 would be approximately −10 volts and the source 403 would be clamped at approximately −0.7 volts).

Aside from oxide damage to $Q_1$, the configuration of FIG. 5A has another disadvantage. Threshold voltage matching $\Delta V_T$ between $Q_1$ and $Q_2$ scales inversely with the square root of the gate areas of the transistors. That is:

$$\Delta V_T \propto \frac{1}{\sqrt{GateArea}}$$

Figure 5D:
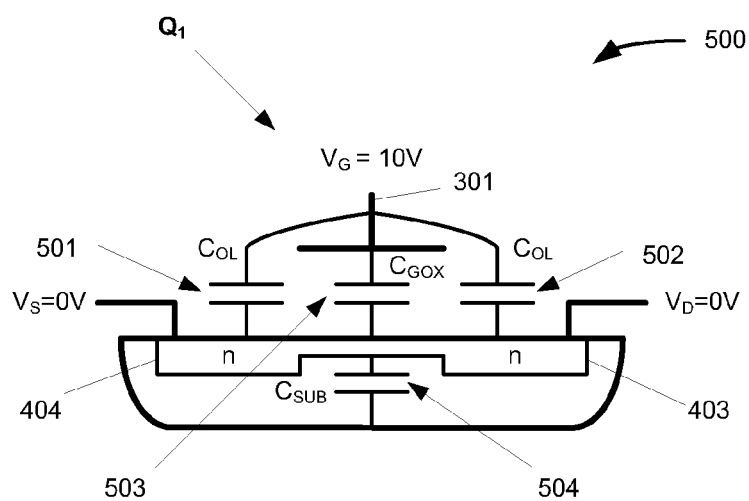
FIG. 5D illustrate a cross-section of a conventional sense transistor.

Therefore, to achieve good threshold voltage matching, the gate areas of $Q_1$ and $Q_2$ will be large. The gate capacitance $C_G$ is directly proportional to the gate area, so the gate capacitance of $Q_1$ will also be large. FIG. 5D is a cross-section 500 of sense transistor $Q_1$. As illustrated in FIG. 5D, transistor $Q_1$ has gate-drain overlap capacitance 501 ($C_{OL}$), gate-source overlap capacitance 502 ($C_{OL}$), gate oxide capacitance 503 ($C_{GOX}$), and substrate capacitance 504 ($C_{SUB}$). The drain and source of $Q_1$ will appear as virtual grounds to the program or erase pulse. As such, the total gate capacitance of $Q_1$ will be $C_G = 2C_{OL} + C_{GOX}$. This capacitance adds in parallel to $C_{TD}$ of the memory transistor 100, reducing the coupling coefficient of the programming and erase voltages to the floating gate, and reducing the magnitude of the floating gate voltage in the programmed and erased states for any given program or erase duration. That is:

$$V'_{FG} = V_{PP} \frac{C_{CAP}}{(C_{TD} + C_{CAP} + C_G)} < V_{PP} \frac{C_{CAP}}{(C_{TD} + C_{CAP})}$$

Figure 6A:
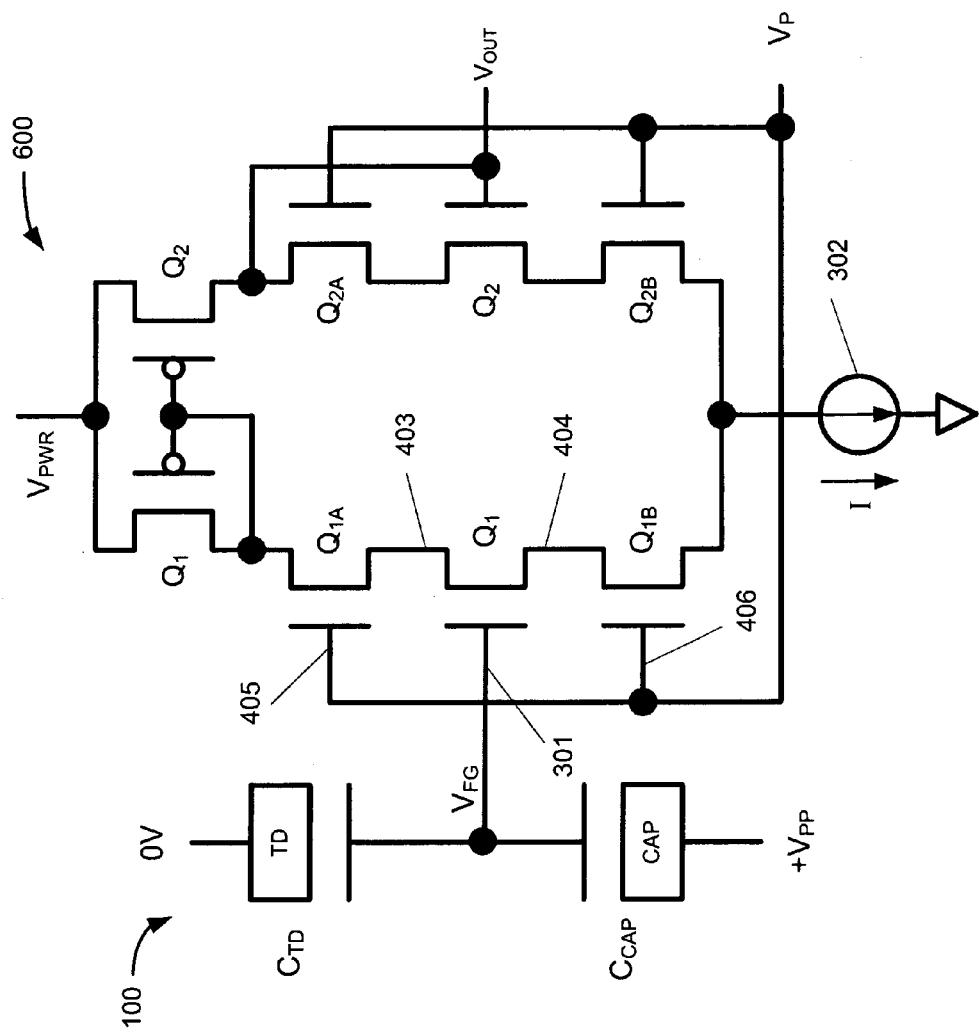
FIG. 6A is a schematic illustration of a sense amplifier in one embodiment of the present invention.

FIG. 6A illustrates a sense amplifier 600 in one embodiment that addresses the aforementioned problems. As illustrated in FIG. 6A, sense amplifier 600 includes 4 additional isolation/coupling transistors $Q_{1A}$, $Q_{1B}$, $Q_{2A}$ and $Q_{2B}$. Transistor $Q_{1A}$ is coupled between the drain 403 of $Q_1$ and current mirror transistor $Q_3$. Transistor $Q_{1B}$ is coupled between the source 404 of $Q_1$ and the current source 302. The gates 405 and 406 of $Q_{1A}$ and $Q_{1B}$ are connected to a control voltage $V_P$, described below. Transistors $Q_{2A}$ and $Q_{2B}$ are disposed similarly with respect to output transistor $Q_2$ and control voltage $V_P$ to balance sense amplifier 600. In one embodiment, transistor Q2 is matched to transistor $Q_1$, transistor $Q_{1A}$ is matched to transistor $Q_{2A}$ and transistor $Q_{1B}$ is matched to transistor $Q_{2B}$.

Figure 6B:
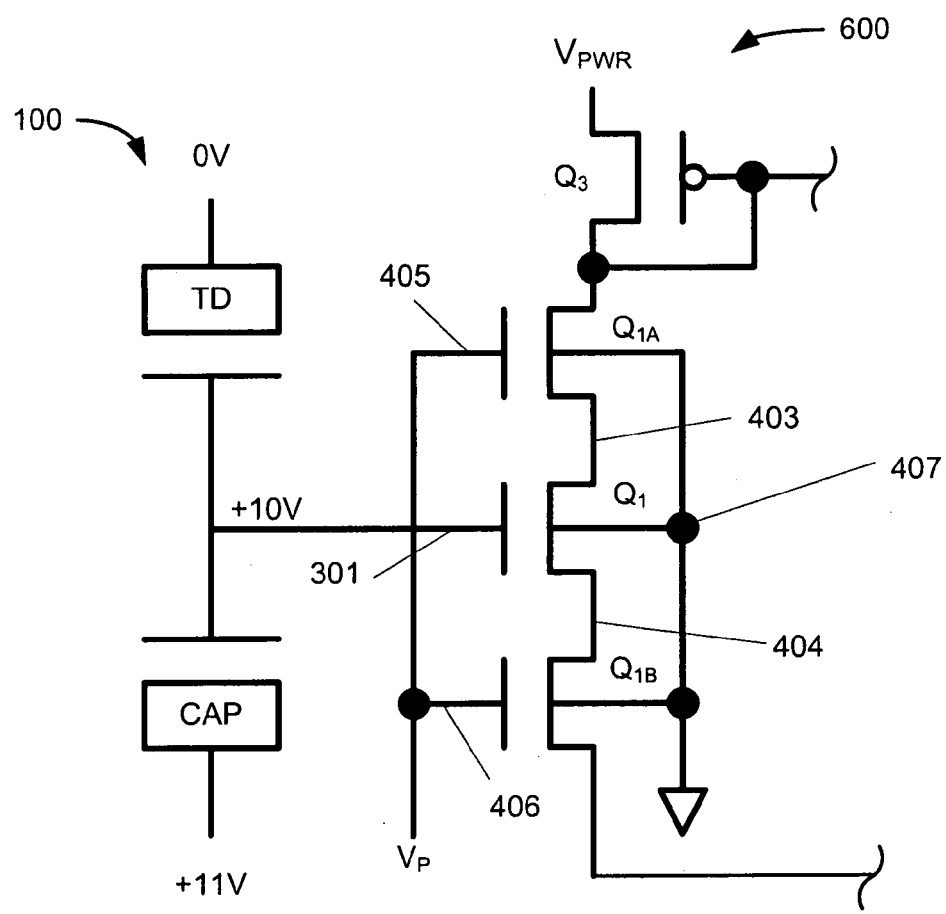
FIG. 6B illustrates sense transistor protection in one embodiment of the present invention.
Figure 6C:
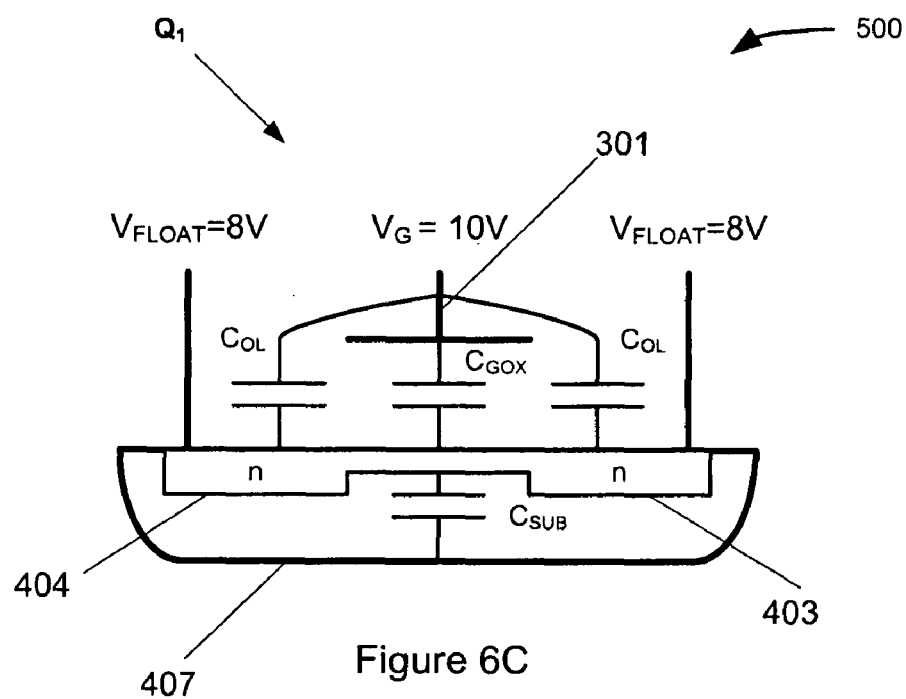
FIG. 6C is a cross-section of a sense transistor illustrating sense transistor protection in one embodiment of the present invention.

FIG. 6B illustrates the sense transistor side of sense amplifier 600, coupled to memory transistor 100, further illustrating a common substrate connection 407 among transistors $Q_1$, $Q_{1A}$ and $Q_{1B}$. When memory transistor 100 is to be read, control voltage $V_P$ may be selected to turn transistors $Q_{1A}$, $Q_{1B}$, $Q_{2A}$ and $Q_{2B}$ on, which effectively reduces sense amplifier 600 to conventional sense amplifier functionality. To protect sense transistor $Q_1$ from damage during the erase cycle of the memory transistor, and to reduce the parasitic gate capacitance of sense transistor $Q_1$ during both the erase cycle and the programming cycle, control voltage $V_P$ is selected to turn off transistors $Q_{1A}$, $Q_{1B}$, $Q_{2A}$ and $Q_{2B}$ to float the source and drain of $Q_1$ (and also the source and drain of $Q_2$) during the erase and program cycles. With $Q_{1A}$ and $Q_{1B}$ turned off, the source and drain of $Q_1$ will float to a voltage given by:

$$V_{FLOAT} = V_{FG} \frac{(C_{GOX} + 2C_{OL})}{(C_{GOX} + 2C_{OL} + C_{SUB})}$$

where $C_{SUB}$ is the substrate capacitance of $Q_1$. For typical sense transistor geometry, the value of $C_{SUB}$ may be approximately 25% of the combined value of $C_{GOX}$ and $2C_{OL}$, such that for a floating gate voltage of 10 volts, $V_{FLOAT}$ will be approximately 8 volts as illustrated in FIG. 6C. Thus, the stress on the gate oxide of $Q_1$ will be reduced from approximately 9.3 volts to approximately 2 volts, which is well below the damage threshold of a typical sense transistor. Moreover, the parasitic gate capacitance of $Q_1$ is reduced during both the programming and erase cycles of the memory transistor when $Q_1$ is isolated by $Q_{1A}$ and $Q_{1B}$. As previously noted, the parasitic capacitance of Q1 reduces the coupling coefficient between the erase and programming voltages and the floating gate voltage of the memory transistor. Without the isolation transistors, the total parasitic gate capacitance of Q1 is:

$$C_G = 2C_{COL} + C_{GOX}$$

With the isolation transistors, the total parasitic gate capacitance of Q1 is given by:

$$C'_G = \frac{(2C_{COL} + C_{GOX})(C_{SUB})}{(2C_{COL} + C_{GOX} + C_{SUB})}$$

Figure 7:
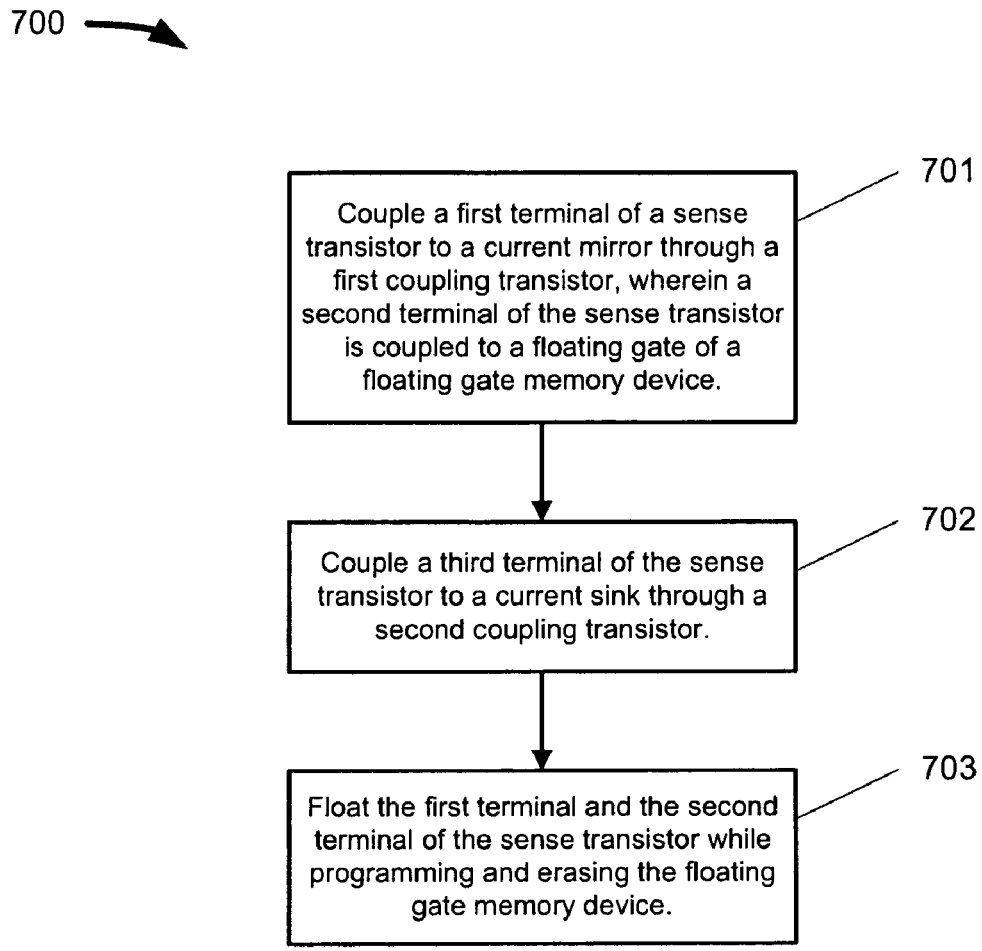
FIG. 7 is a flowchart illustrating a method for sense transistor protection in one embodiment of the present invention.

For the example given above, where $C_{SUB}$ is approximately 25% of ($2C_{OL} + C_{GOX}$), the parasitic gate capacitance will be reduced by a factor of five. FIG. 7 is a flowchart illustrating a method 700 according to one embodiment of the invention. Method 700 includes coupling a first terminal of a sense transistor to a current mirror through a first coupling transistor, wherein a second terminal of the sense transistor is coupled to a floating gate of a floating gate memory device (operation 701). Method 700 further includes coupling a third terminal of the sense transistor to a current sink through a second coupling transistor (operation 702) and floating the first terminal and the second terminal of the sense transistor while programming and erasing the floating gate memory device (operation 703).

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method in a sense amplifier, comprising:
    coupling a first terminal of a sense transistor to a current mirror through a first coupling transistor, wherein a second terminal of the sense transistor is coupled to a floating gate of a floating gate memory device;
    coupling a third terminal of the sense transistor to a current sink through a second coupling transistor; and
    floating the first terminal and the second terminal of the sense transistor while programming and erasing the floating gate memory device.

2. The method of claim 1, wherein the sense transistor, the first coupling transistor and the second coupling transistor comprise MOS transistors, wherein a source of the first coupling transistor is connected to a drain of the sense transistor, wherein a source of the sense transistor is connected to a drain of the second coupling transistor, and wherein floating the sense transistor comprises applying a control voltage to control gates of the first coupling transistor and the second coupling transistor, wherein the control voltage is configured to turn off the first coupling transistor and the second coupling transistor.

3. The method of claim 2, further comprising configuring the control voltage to turn on the first coupling transistor and the second coupling transistor to read the floating gate memory device.

4. An apparatus, comprising:
  a first transistor coupled to a floating gate of a memory device;
  a second transistor coupled between the first transistor and a current mirror; and
  a third transistor coupled between the first transistor and a current sink, wherein the second transistor and the third transistor each have a control terminal coupled to a control voltage, and wherein the control voltage is configured to turn the second transistor and the third transistor off when the memory device is being programmed, wherein the first transistor is protected from a programming voltage and a coupling coefficient of the memory device is increased.

5. The apparatus of claim 4, wherein the control voltage is configured to turn the second transistor and the third transistor on to read the memory device.

6. The apparatus of claim 4, wherein the first transistor comprises an MOS sense transistor having a first gate, a first drain and a first source, the second transistor comprises a first MOS coupling transistor having a second gate, a second drain and a second source and the third transistor comprises a second MOS coupling transistor having a third gate, a third drain and a third source, wherein the first gate is coupled to the floating gate of the memory device, the first drain is coupled to the second source and the first source is coupled to the third drain, wherein the second drain is coupled to the current mirror and the third source is coupled to the current source, and wherein the second gate and the third gate are coupled to the control voltage.

7. The apparatus of claim 4, wherein the first transistor, the second transistor and the third transistor comprise one side of a balanced sense amplifier, the apparatus further comprising:
  a fourth transistor;
  a fifth transistor coupled between the fourth transistor and the current mirror; and
  a sixth transistor coupled between the fourth transistor and the current sink, wherein the fifth transistor and the sixth transistor each have a control terminal coupled to the control voltage, and wherein the control voltage is configured to turn the fifth transistor and the sixth transistor off when the memory device is being programmed.

8. The apparatus of claim 7, wherein the fourth transistor is matched to the first transistor, the fifth transistor is matched to the second transistor and the sixth transistor is matched to the third transistor.

9. The apparatus of claim 7, wherein the control voltage is configured to turn the fifth transistor and the sixth transistor on to read the memory device.

10. The apparatus of claim 7, wherein the fourth transistor comprises an MOS output transistor having a fourth gate, a fourth drain and a fourth source, the fifth transistor comprises a third MOS coupling transistor having a fifth gate, a fifth drain and a fifth source and the sixth transistor comprises a fourth MOS coupling transistor having a sixth gate, a sixth drain and a sixth source, wherein the fourth drain is coupled to the fifth source and the fourth source is coupled to the sixth drain, wherein the fifth drain is coupled to the current mirror and the sixth source is coupled to the current source, and wherein the fifth gate and the sixth gate are coupled to the control voltage.

11. An apparatus, comprising:
  means for floating a source and a drain of a MOS sense transistor during memory program and erase operations;
  means for reducing voltage-induced gate oxide stress in the MOS sense transistor during memory program and erase operations; and
  means for reducing parasitic gate capacitance in the MOS sense transistor during the memory program and erase operations.

* * * * *